United States Patent [19]

Zwarts

[11] Patent Number: 4,736,459
[45] Date of Patent: Apr. 5, 1988

[54] FM RECEIVERS USING TWO-TERMINAL NEGATIVE ADMITTANCE NETWORKS

[75] Inventor: Cornelius M. G. Zwarts, Gatineau, Canada

[73] Assignee: Canadian Patents and Development Limited, Ottawa, Canada

[21] Appl. No.: 851,552

[22] Filed: Apr. 14, 1986

[51] Int. Cl.$^4$ .............................................. H04B 1/10
[52] U.S. Cl. .................................. 455/205; 455/208; 455/258; 455/333
[58] Field of Search ............... 455/205, 208, 258, 264, 455/318, 319, 333, 324; 333/216

[56] References Cited

U.S. PATENT DOCUMENTS

| | | | |
|---|---|---|---|
| 3,493,870 | 2/1970 | Kupfer | 455/333 |
| 4,184,120 | 1/1980 | Teshirogi | 455/333 |
| 4,525,186 | 11/1986 | Zwarts | 333/216 |

Primary Examiner—Michael A. Masinick
Attorney, Agent, or Firm—Yoshiharu Toyooka

[57] ABSTRACT

FM receivers which are very compact and simple yet have high sensitivity are described. The FM receivers are of the homodyne type or heterodyne type including a frequency converter. All the FM receivers contain two-terminal negative admittance networks.

2 Claims, 6 Drawing Sheets

FM RECEIVERS USING TWO-TERMINAL NEGATIVE ADMITTANCE NETWORKS

The present invention relates to FM receivers and in particular is directed to very simple, compact FM receivers using two-terminal negative admittance networks.

BACKGROUND OF THE INVENTION

In the conventional approach to FM receivers typically one utilizes one separate electrical network for each function to be performed such as amplification, frequency mixing, demodulation, etc. In the present invention, FM receivers include one or a small number of electrical networks, such as two-terminal negative admittance networks which perform multiple functions to form complete receivers. The various functions performed simultaneously by the electrical networks are primarily based on particular features of the non-linear negative admittance of the two-terminal negative admittance network.

In another U.S. patent application Ser. No. 725,999 entitled "Two terminal negative admittance network" filed on Apr. 22, 1985 by the inventor of the present application, (now U.S. Pat. No. 4,625,186 issued Nov. 25, 1986) a pair of active elements such as transistors are employed in a novel circuit to form a negative admittance network. Although the disclosure of the above referenced application is incorporated in the disclosure of the present application, it is felt that the present invention would be more readily understood, if a brief description of the two-terminal negative admittance networks is included in this disclosure. The brief description will be found below.

OBJECTS OF THE INVENTION

It is therefore a principal object of the present invention to provide compact and simple FM receivers utilizing negative admittance networks.

It is another object of the present invention to provide FM homodyne receivers which employ a negative admittance network.

It is a further object of the present invention to provide FM superheterodyne receivers which use negative admittance networks.

SUMMARY OF THE INVENTION

Briefly stated, an FM homodyne receiver includes a two-terminal negative admittance network which has two terminals and exhibits a negative admittance between them. The receiver further contains resonance structure which is connected in series with the negative admittance network. As readily understood by those skilled in the art, the resonance structure can be made by a coil, a transmission line structure or the like. Some preferred forms of the resonance structure will be described later in this application. The resonance structure operates as an antenna to capture the RF signal. A bipolar transistor is also provided at the point connecting the negative admittance network and the coil, to produce the frequency demodulated signal at its output.

In accordance with another embodiment of the present invention, a superheterodyne FM receiver is disclosed as containing first and second two-terminal negative admittance networks, each having first and second terminals and exhibiting a negative admittance between the terminals. The receiver further includes a resonance structure in which an RF signal is induced and the resonance structure is in series with the first negative admittance network. A first transistor is connected to the point connecting the coil and the first negative admittance network. Second transistor is provided in series with the first bipolar transistor. The superheterodyne receiver still includes a stage consisting of a coil and a second negative admittance network connected in series with each other. The output of the second transistor is connected to the point connecting the coil and the second negative admittance network to which point a third transistor is connected. The third bipolar transistor produces a frequency demodulated signal at its output. The receiver includes further a frequency feedback circuit which feeds back the demodulated signal to the second transistor.

BRIEF DESCRIPTION OF THE DRAWINGS

For a more complete understanding of the present invention and for further objects and advantages thereof, references may be made to the following description taken in conjunction with the accompanying drawings in which.

BRIEF DESCRIPTION OF TWO-TERMINAL NEGATIVE ADMITTANCE NETWORKS

Figure 1:
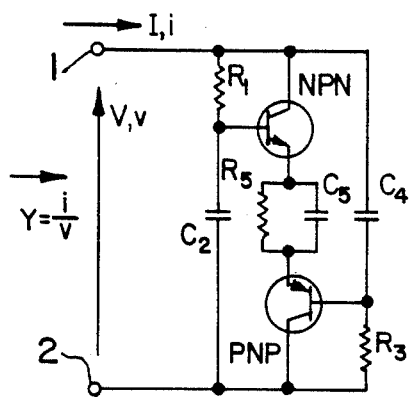
FIGS. 1 and 2 show two typical negative admittance networks which can be used in the present invention and which are the preferred embodiments for RF and IF frequencies respectively.
Figure 2:
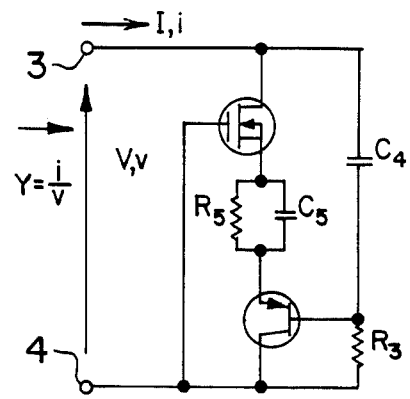

The admittance Y of the network shown in FIGS. 1 and 2, looking into the terminals 1 and 2 or terminals 3 and 4 is $$Y = i/v = G + jB$$

where Y is complex having G (conductance) the real part and B (susceptance) the imaginary part. The admittance is taken to be negative when the real part G is negative. The input voltage is v and the input current is i for both networks of the figures. The admittance is non-linear when either G or B or both are a function of the input current i or the input voltage v.

The negative real part, negative conductance G of the admittance is creased by various mechanism:

(a) at low operating frequencies, a parallel-voltage series-current positive feedback action creates a negative conductance G.

For medium and high operating frequencies other mechanisms rapidly overtake the feedback action, i.e.

(b) the active devices, such as the transistors in the networks, become increasingly complex due to their small internal capacitances and dynamic impedances, (c) the lower effective impedance of $R_5$ and $C_5$ in parallel (shown in FIGS. 1 and 2) towards higher frequencies;

(d) transit diffusion delay across the base regions of the transistors.

These effects (b), (c) and (d) are essential in producing a negative conductance for higher operating frequencies.

Figure 3A:
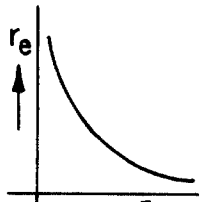
FIGS. 3(a), 3(b), 3(c) and 3(d) are curves showing that the emitter resistance $r_e$ and the base-emitter capacitance of a bipolar transistor and the transconductance and gate-source capacitance $C_{gs}$ of a field-effect transistor are non-linear.
Figure 3B:
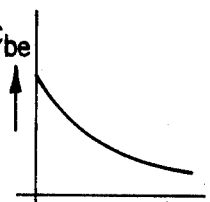
Figure 3C:
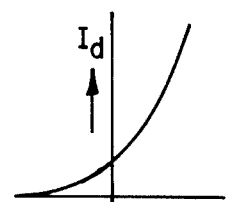
Figure 3D:
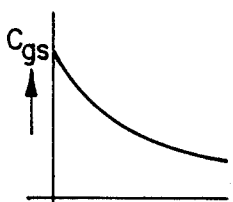

The negative admittance is non-linear. This is caused primarily by the non-linearity in the emitter resistance $r_e$ and the base-emitter capacitance $C_{be}$ of the bipolar transistors and the non-linearity in the gate-source capacitance $C_{gs}$ and the transconductance of the field-effect transistors shown in FIGS. 3(a), (b), (c) and (d). These non-linearities are very essential in the operations of the FM receivers.

DETAILED DESCRIPTION OF THE FM HOMODYNE RECEIVER

Figure 4:
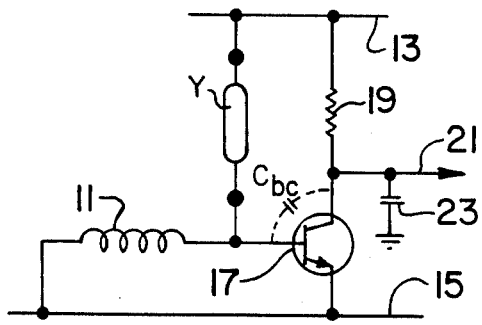
FIG. 4 is a diagram of a FM homodyne receiver according to the present invention.

Referring to FIG. 4, it is shown that a basic FM homodyne receiver circuit uses a two-terminal negative admittance, designated by a symbol indicated by Y. This symbol Y will be used throughout this specification to show a two-terminal negative admittance, such as those shown in FIGS. 1 and 2.

In FIG. 4, the two-terminal negative admittance is connected in series with a coil 11 between the power supply 13 and the groundplane 15. A bipolar transistor 17 is connected at midpoint and is fed by the power supply through a resistor 19. The transistor 17 produces a frequency demodulated output signal at the collector 21. The capacitor 23 together with resistor 19 forms a low-pass filter, by-passing the high frequency signal and setting the low pass bandwidth of the demodulated output signal. The inter-electrode capacitance $C_{bc}$ of the bipolar transistor 17 is included in the figure to show that the negative frequency feedback is being performed. The negative frequency feedback will be discussed later in this disclosure.

The homodyne receiver shown in the figure performs, unlike conventional receivers, all the functions needed for FM signal reception, such as functions of antenna, RF amplifier, local oscillator, mixer, limiter, synchronous FM discriminator, automatic frequency control and audio amplifier. It also includes a frequency-feedback-loop via the base-collector capacitance of transistor 17.

A detailed description of these functions will be given below under separate sub-headings.

ANTENNA

The receiver, as shown in FIG. 4, uses only one resonance circuit. It consists of an "external" inductor and the "internal" capacitors, made up of the stray capacitances and the small interelectrode capacitances of the bipolar junction transistor 17 and the susceptance part of the negative admittance.

The RF signal coil 11 forms the external inductor of the resonance circuit and is optimized to be able to replace the function of a conventional antenna. This optimization calls for minimum capacitance in the tank circuit, therefore tuning capacitors are eliminated. Moreover the susceptance part of the admittance is minimized selecting high frequency transistors. For the same resonance frequency this allows one to increase considerably the inductance of the RF signal coil by increasing the number of turns and/or the diameter of the coil. This increase in number of turns and/or diameter allows to capture much more effectively the magnetic field component and hence to become effectively an inductive antenna. It was found that mounting the coil over a groundplane further increases its ability to operate as an antenna.

Figure 5A:
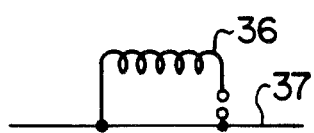
FIGS. 5(a), 5(b), 5(c) and 5(d) show schematically some antenna tank "coils" which are used in the present invention.
Figure 5B:
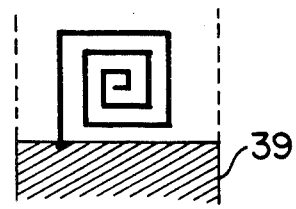
Figure 5C:
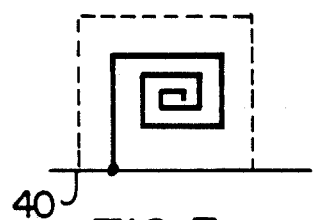
Figure 5D:
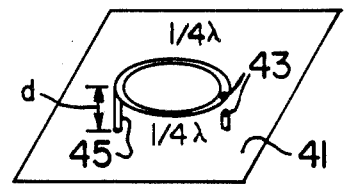

These "oversized" coils have wirelength which can be a considerable portion of the wavelength. It is therefore more appropriate to consider the coil as a helix transmission line mounted over a groundplane. For lower frequencies one can use ferrite rods inside the helix transmission line to maintain reasonable physical dimensions. Various coils used are shown in FIGS. 5(a), (b), (c) and (d). In FIG. 5(a) is shown a helix transmission line 36 indicating a short helix transmission line over the groundplane 37 with the terminals at one end of the line and the groundplane. FIGS. 5(b) and (c) show flat coils etched in printed circuit boards. The groundplane is designated by 39 and 40 and the terminals are shown by dots at the ends of the coils. For very high frequencies a new form of transmission line resonating structure has been developed. As shown in FIG. 5(d), it consists of a closed circular conductor mounted parallel to the groundplane 41 at a height d, shown in the figure, shorted at one point to the groundplane. The terminals are taken at 43 opposite to the shorting connection 45. This structure is particularly useful at frequencies approaching 1 GHz where its physical size becomes very attractive.

LOCAL OSCILLATOR

Conventional oscillators use positive feedback to create and maintain oscillations in a resonance circuit. With a negative admittance, however, simply shunting across a suitable resonance circuit will generate and maintain oscillations if the power supplied by the negative conductance of the admittance, at the resonance frequency, is larger than the power dissipated in the resonance circuit. The inherent non-linearities in the negative admittance will result in a stable amplitude for the oscillations where power delivered and power dissipated are exactly equal.

Figure 6A:
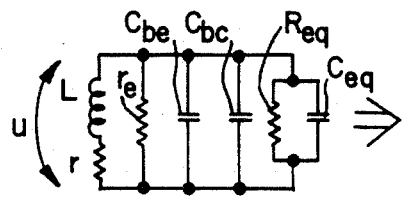
FIGS. 6(a), 6(b) and 6(c) show equivalent input circuits of the radio receiver shown in FIG. 4.
Figures 6B, 6C:
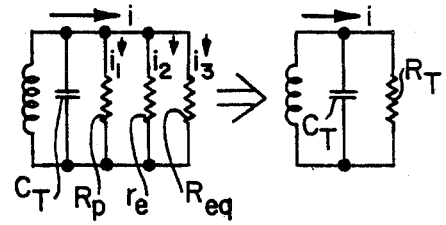

The operation of the oscillator is illustrated with FIGS. 6(a), (b), (c), 7, 8(a), (b), (c) and 9(a), (b), (c). FIGS. 6(a), (b) and (c) give the equivalent circuit diagrams. In FIG. 6(a), U is a voltage generated across the coil whose inductance is L and internal resistance is r. The bipolar transistor has the emitter resistance $r_e$ and input interelectrode capacitance $C_{be}$ between the base and emitter and $C_{bc}$ between the base and collector. The negative admittance network is reduced to the equivalent resistance $R_{eq}$ and capacitance $C_{eq}$. FIG. 6(b) is simplified version of FIG. 6(a) using an equation $$R_p = L/rC_T$$

where $C_T = C_{be} + C_{bc} + C_{eq}$ and $R_p$ is the equivalent parallel loss-resistance of the coil.

FIG. 6(b) is ultimately simplified to FIG. 6(c) where $R_T$ represents resultant resistance of $R_p$, $r_e$ and $R_{eq}$ and the current is indicated by i.

Figure 7:
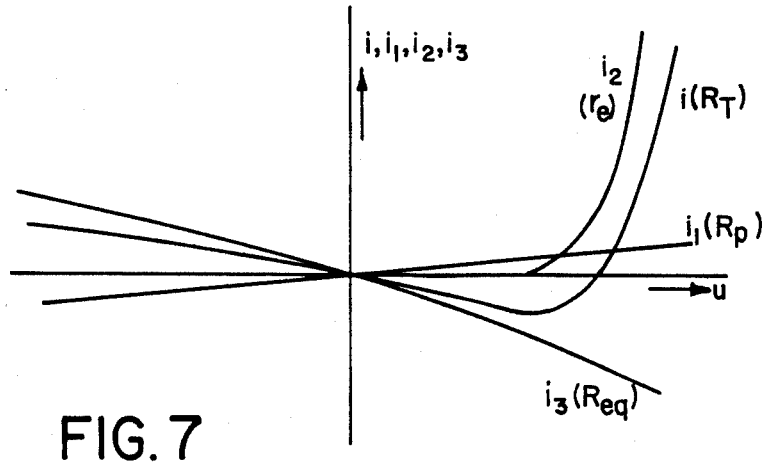
FIG. 7 indicates the current-voltage behaviour of various parameters shown in FIGS. 6(a), 6(b) and 6(c).

FIG. 7 shows the current-voltage behaviour of $r_e$, $R_T$, $R_p$ and $R_{eq}$. In the figure, $i_1$, $i_2$, $i_3$ and i represent the current flowing through $R_p$, $r_e$, $R_{eq}$ and $R_T$ respectively as indicated in FIGS. 6(b) and (c).

Figure 8A:
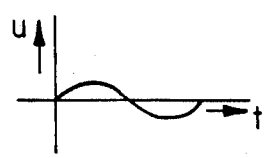
FIGS. 8(a), 8(b) and 8(c) and 9(a), 9(b) and 9(c) are curves illustrating the behaviour of the oscillating tank circuit during build-up period and equilibrium respectively.
Figure 8B:
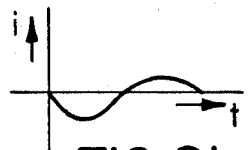
Figure 8C:
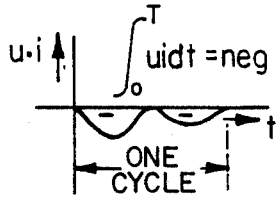

The resistance $R_T$, at i=0 and u=0 as shown in FIG. 7 is negative. Therefore the circuit will start oscillating at the resonance frequency. The amplitude of oscillation will continue to increase until some equilibrium is reached. The build-up of the oscillation voltage and the stable equilibrium value reached are illustrated in FIGS. 8(a), (b), (c) and 9(a), (b), (c). The power dissipated in the resonance circuit over one cycle of oscillation is expressed by:

$$P = \int_0^T u(t) \cdot i(t) \, dt.$$

Figure 9A:
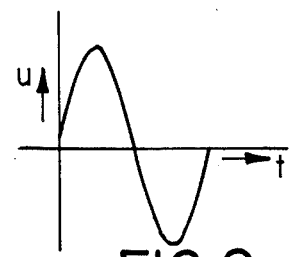
Figure 9B:
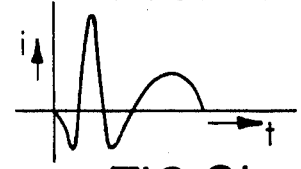
Figure 9C:
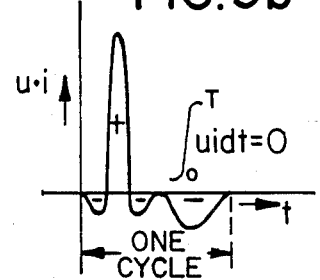

If P is positive, then power is dissipated, whereas if P is negative, power is supplied to the resonance circuit. In FIGS. 8(a), (b), (c), P is negative hence power is supplied and the amplitude of the oscillation continues to increase. In FIGS. 9(a), (b), (c), the equilibrium situation is reached, i.e. P=0, or during one cycle, the power dissipated is exactly equal to the power delivered by the negative resistance. Graphically this means that the positive and negative surface areas have become equal.

RF AMPLIFIER, SYNCHRONOUS FM DISCRIMINATOR AND LIMITER

The RF signal is captured by a tank circuit which is oscillating at its resonance frequency. It will be shown how, when the RF and the LO-frequencies are very close, synchronization of the two signals occur.

Furthermore it will be shown how, effectively, amplification of the RF-signal is obtained. Moreover that, for certain conditions, the frequency modulation of the RF-signal not only results in a frequency modulation of the local oscillator due to synchronization, but also in a linear transfer of the frequency modulation of the RF-signal to amplitude modulation of the oscillator signal, hence frequency discriminator action.

Also, the FM-to-AM conversion will be shown to be independent of the amplitude of the RF signal, therefore the equivalent action of a limiter is performed.

Therefore the analysis below will show how the equivalent functions of RF-amplifier, limiter and synchronous FM-discriminator are obtained. First some basic relations will be derived to be applied subsequently to analyze the RF-amplification and the synchronous FM discriminator/limiter action.

Referring back to FIGS. 4 and 6(a), (b), (c) where the receiver circuit and its equivalent are shown.

If the effective conductance in parallel with the inductance L is negative, oscillations will result. The frequency is determined by the value of L and the total equivalent circuit capacitance $C_T$ in parallel with the inductance L. The amplitude of the oscillation is stabilized by the non-linear behaviour of the conductance. Both the conductance part of the negative admittance Y and that of the transistor 17 are non-linear. The non-linearity of the transistor 17, however, becomes dominant, when the signal exceeds the base-emitter threshold.

Transistor 17 is configured as a C-class amplifier. For small amplitude oscillation, the transistor 17 does therefore not load the resonance circuit. If the amplitude of oscillation increases and exceeds the base-emitter threshold voltage, then the transistor starts drawing current during the positive peaks of the oscillator signal. The loading by transistor 17 increases very rapidly, therefore the amplitude of oscillation stabilises at the onset of the threshold voltage, about 0.65 volts.

As seen in FIG. 5(a), the capacitance of the resonance circuit consists of the equivalent capacitance $C_{eq}$ and interelectrode capacitances $C_{be}$ and $C_{bc}$ of the transistor 17. These capacitances are voltage dependent and hence non-linear.

Figure 10:
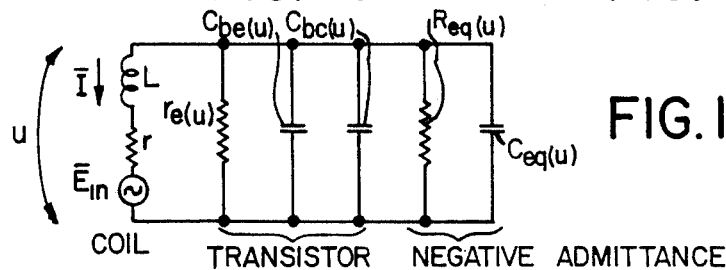
FIGS. 10 and 11 are small signal equivalent circuits of a homodyne receiver.
Figure 11:
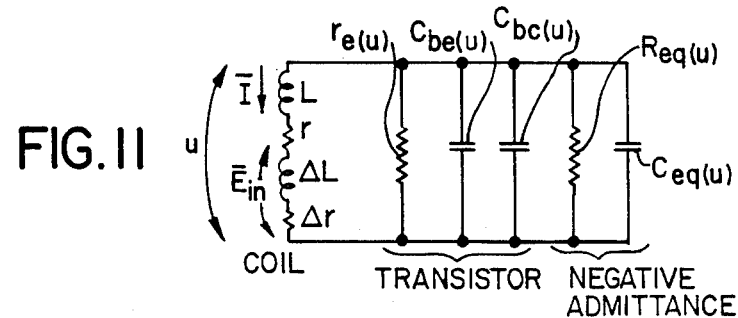

Now let us consider a small signal with a frequency equal or very close to the resonance frequency, being introduced into the oscillating network either by injection from a current source or induced by flux linkage from a remote transmitter. Both cases are equivalent to a small voltage source $\overline{E}_{in}$ put in series with the coil as shown in FIG. 10. In the figure, the resonant voltage $\overline{U}$, current $\overline{I}$ and induced signal voltage $\overline{E}_{in}$ are shown. It is assumed that $|\overline{E}_{in}| << |\overline{U}|$. The current $\overline{I}$ through the inductor L can then be considered constant and independent of the voltage source $\overline{E}_{in}$. This assumption allows us to replace the voltage source $\overline{E}_{in}$ by a small fictitious complex impedance $\bar{z}$ which will be given by $$\bar{z} = \Delta r + j\omega_0 \Delta L = \frac{\overline{E}_{in}}{\overline{I}}$$

using small disturbances $\Delta L$ and $\Delta r$ of inductance L and resistance r respectively. If $\bar{z}$ is chosen equal to $$\bar{z} = \frac{\overline{E}_{in}}{\overline{I}}$$

then FIGS. 10 and 11 are equivalent. The equivalent model of FIG. 11 permits us to analyze the relationship between both frequency and amplitude of the oscillation as a function of the induced voltage in terms of a small disturbance of the inductance L by a small impedance $\bar{z}$.

In FIG. 11, the following symbols are used:

$$\overline{I} = Ie^{j\omega_0' t}$$

$$\overline{E}_{in} = E_{in}e^{j(\omega_1 t + \phi)}$$

$$\overline{U} = Ue^{j(\omega_0' t + \frac{\pi}{2})}$$

$$\overline{Z} = \Delta r + j\omega_0 \Delta L = \frac{\overline{E}_{in}}{\overline{I}}$$

where
$\omega_1$ = frequency of induced signal $\overline{E}_{in}$ $\omega_0$ = undisturbed resonance frequency of oscillator
$\omega_0'$ = instantaneous frequency of oscillator
$(\omega_1 - \omega_0)$ = difference in frequency between $\overline{E}_{in}$ and undisturbed frequency of oscillator
$(\omega_0' - \omega_0)$ = change in oscillator frequency due to induce signal
$(\omega_1 - \omega_0')$ = instantaneous beat frequency between oscillator and injected signal
$\phi$ = instantaneous phase angle between current $\overline{I}$ and voltage $\overline{E}_{in}$.

The differential equation relating $E_{in}$ and I is $$\frac{d\phi}{dt} = (\omega_1 - \omega_0')$$

$d\phi/dt$ represents the instantaneous beat frequency. To simplify the analysis it is assumed that synchronization between induced signal $\overline{E}_{in}$ and oscillator signal $\overline{U}$ has occured. Therefore $$\frac{d\phi}{dt} = 0$$

hence $\phi$ = constant and $\omega_1 = \omega_0'$.

The frequency $\omega_0$ and the amplitude U of oscillation are non-linear functions of r and L. For small variations around operating point $\omega_0$ and $U_0$, one can linearize these relations using expansion in Taylor series for a function of two variables and retaining only the first order terms.

$$U = U_o + \Delta r \frac{\partial U}{\partial r} + \omega_0 \Delta L \frac{1}{\omega_0} \frac{\partial U}{\partial L} \quad (1)$$

$$\omega_o' = \omega_o + \Delta r \frac{\partial \omega_0}{\partial r} + \omega_0 \Delta L \frac{1}{\omega_0} \frac{\partial \omega_0}{\partial L} \quad (2)$$

Let us consider now $$\frac{\partial U}{\partial r} \text{ and } \frac{1}{\omega_o} \frac{\partial U}{\partial L}$$

as the components of a vector $\overline{A}$ at angle $\alpha$ and $$\frac{\partial \omega_o}{\partial r} \text{ and } \frac{1}{\omega_o} \frac{\partial \omega_o}{\partial L}$$

as the components of a vector $\overline{F}$ at angle $\beta$. then, $$\frac{\partial U}{\partial r} = A \cos\alpha \quad \frac{1}{\omega_o} \frac{\partial U}{\partial r} = A \sin\alpha$$

$$\frac{\partial \omega_o}{\partial r} = F \cos\beta \quad \frac{1}{\omega_o} \frac{\partial \omega_o}{\partial L} = F \sin\beta$$

Meanwhile, the fictitious impedance $\overline{z}$ is defined as $$z = \frac{\overline{E}_{in}}{\overline{I}} = \frac{E_{in}}{I} e^{j(\omega_1 t - \omega_0 t + \phi)}$$

where $\phi$ is a phase angle between $\overline{E}_{in}$ and $\overline{I}$. Signals are synchronized, hence $\omega_1 = \omega_0'$, thus $$\overline{z} = \frac{E_{in}}{I} e^{j\phi} = \left(\frac{E_{in}}{I} \cos\phi\right) + j\left(\frac{E_{in}}{I} \sin\phi\right)$$

Because $\overline{z} = \Delta r + j\omega_0 \Delta L$, it follows:

$$\Delta r = \frac{E_{in}}{I} \cos\Phi$$

$$\omega_0 \Delta L = \frac{E_{in}}{I} \sin\Phi$$

Consequently equations (1) and (2) can be rewritten into:

$$(U - U_0) = \frac{E_{in}}{I} A \cos(\phi - \alpha) \quad (3)$$

$$(\omega_0' - \omega_0) = \frac{E_{in}}{I} F \cos(\phi - \beta) \quad (4)$$

Relationships (3) and (4) will be used to analyze the functions of "RF-amplifier" and "Synchronous FM discriminator".

RF-AMPLIFIER

The RF signal is induced into a circuit which is oscillating at the frequency of the RF-signal (signals are synchronized). The RF gain is defined as the change, $\Delta U = U_o - U$, in the amplitude brought about by the induced RF-signal, $\overline{E}_{in}$.

From equation (3) above, the RF-gain is expressed, $$RF\text{-gain} = \frac{U - U_0}{E_{in}} = \frac{A}{I} \cos(\phi - \alpha)$$

Optimum RF gain is obtained for minimum I and maximum A.

Various ways of optimizing RF gain are discussed below:

"I" It is obvious that I can be reduced by decreasing U, the amplitude of oscillation, since I is directly proportional to U. The current I is also reduced by decreasing $C_T$ as much as is possible, allowing the inductance L to increase, keeping the resonance frequency constant. The impedance $\omega_0 L$ is hence maximum and for a given U, minimum current I flows through the inductance L.

"A" Vector $\overline{A}$ is composed of two components $$\frac{\partial U}{\partial r} \text{ and } \frac{I}{\omega_0} \frac{\partial U}{\partial L},$$

then
A is:

$$A = \left\{ \left(\frac{\delta U}{\delta r}\right)^2 + \left(\frac{1}{\omega} \frac{\delta U}{\delta L}\right)^2 \right\}^{\frac{1}{2}}$$

To minimize I, L is maximized, therefore minimizing $$\frac{1}{\omega_0} \frac{\partial U}{\partial L}.$$

Hence to maximize A one is left with $\partial U/\partial L$, which should be made as large as possible. This is obtained by striving for the oscillation to be very marginal, i.e. keeping the non-linearity in the negative conductance $1/R_{eq}$ as small and smooth as possible. Any resistive disturbances $\Delta r$, will then result in a large shift in the amplitude of the oscillation. This can be seen readily from an inspection of FIGS. 7, 9(a), (b), (c).

Making $$\frac{1}{\omega_0} \frac{\partial U}{\partial L}$$

very small and $\partial U/\partial r$ very large yields for $\alpha$:

$$tg\alpha = \left(\frac{1}{\omega_o} \frac{\delta U}{\delta L} \Big/ \frac{\delta U}{\delta r}\right) \approx 0$$

therefore $\alpha \approx \pi_0$. With $\alpha \approx \pi$, it follows that $\cos(\phi - \alpha) = \cos(\phi - \pi) = -\cos\phi$.

The RF gain, and hence the sensitivity, of the receiver is thus optimized with L large, $C_{eq}$ and U small and furthermore keeping the oscillator very marginal, i.e. reducing the non-linearity in the negative admittance to a minimum.

SYNCHRONOUS FM DISCRIMINATOR/LIMITER

Three basic requirements are implicit in the operation of a limiter and a synchronous FM discriminator:
(1) Limiter keeps the output signal constant independent of the induced RF signal.
(2) Synchronization between RF signal and local oscillator signal.
(3) Linear conversion from FM to AM modulation.

The synchronization has been analyzed above and resulted in relationship expressed by equation (4). The maximum values for $\cos(\phi - \beta)$ are $\pm 1$. The maximum range over which synchronization can take place is therefore $$\pm \frac{E_{in}}{I} F \text{ (Hz)}$$

Notice from the expression above that this range is directly proportional to the amplitude $E_{in}$, of the induced RF signal and inversely proportional to the current, I, and hence U, the amplitude of the oscillation.

To analyze the limiter action and the linear conversion of FM and AM modulation we will need both relationships (3) and (4). Eliminating $\phi$ from these equations gives the relationship $$\cos^{-1}\left\{(\omega'_o - \omega_o)\frac{I}{E_{in}F}\right\} - $$

$$\cos^{-1}\left\{(U - U_o)\frac{I}{E_{in}A}\right\} = (\alpha - \beta) \quad (5)$$

One can see from the above equation that the change in amplitude of the oscillator, $(U - U_0)$, is an implicit non-linear function of both the input frequency change, $(\omega_1 - \omega_0) = (\omega_0 - \omega_0)$ and the amplitude, $E_{in}$, of the induced signal. Hence, the two basic requirements for a FM discriminator/limiter, i.e. linear FM to AM conversion and conversion independent of input amplitude, are not satisfied, in general. There are however two specific values for $(\alpha - \beta)$, for which the above requirements are met and they are $(\alpha - \beta) = 0$ and $(\alpha - \beta) = \pi$ rad. In these cases equation (5) above becomes:

$$U - U_0 = \frac{A}{F}(\omega'_0 - \omega_0) \text{ when } (\alpha - \beta) = 0$$

$$U - U_0 = \frac{-A}{F}(\omega'_0 - \omega_0) \text{ when } (\alpha - \beta) = \pi \text{ rad.}$$

Figure 12:
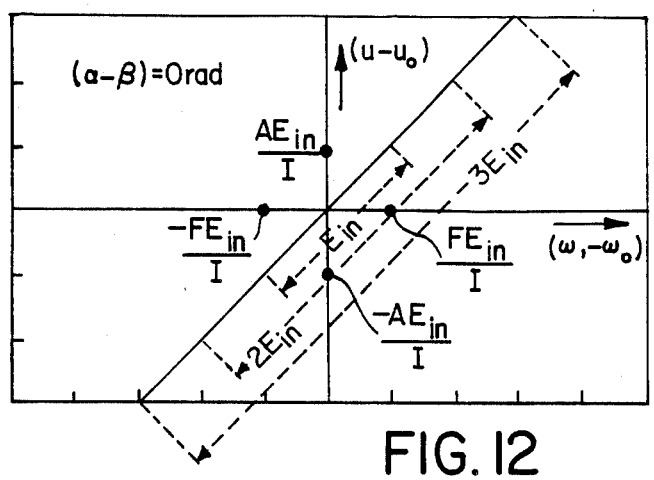
FIGS. 12 and 13 show graphs indicating relationships of output signal amplitudes and frequencies under certain conditions.
Figure 13:
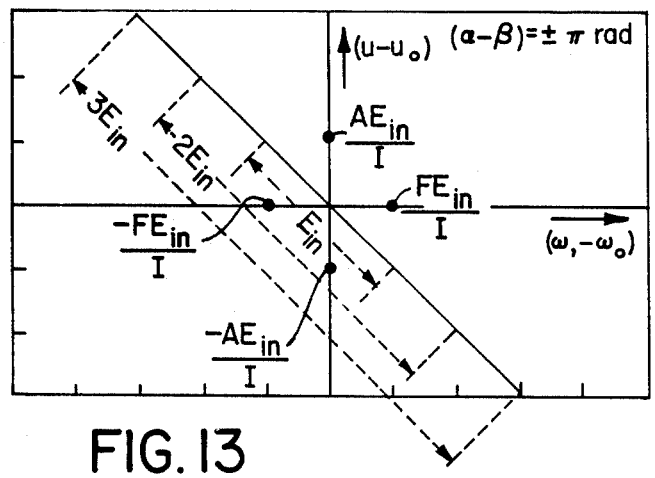

These relations are shown in FIGS. 12 and 13.

It is shown previously that $\alpha \approx \pi$. Hence linear conversion from FM to AM modulation is obtained for $\beta = 0$ or $\beta = \pi$. To show how this condition can be attained we have to look at relationships derived above:

$$\frac{\partial \omega_0}{\partial r} = F\cos\beta \quad \frac{1}{\omega} \frac{\partial \omega_0}{\partial L} = F\sin\beta$$

Combining the above equations gives $$tg\beta = \frac{1}{\omega_o} \frac{\delta\omega_o}{\delta L} \Big/ \frac{\delta\omega_o}{\delta r}$$

Imposing $\beta = 0, \pi$ requires that $$\frac{1}{\omega_0} \frac{\partial \omega_0}{\partial L} << \frac{\partial \omega_0}{\partial r} \quad (6)$$

(For conventional feedback type of oscillators the above condition (6) is not satisfied, in effect the opposite is true.) As explained earlier, the oscillator is very marginal i.e. $\partial U/\partial r$ is very large, hence any change $\Delta r$ results in a large variation in U.

With $C_T$(FIG. 6(c)) being voltage dependent, a large variation in U leads to a corresponding large change in the resonance frequency $\omega_0$ ($C_{bc}$ of transistor 17 also plays an important role as will be described under "frequency-feedback-loop").

Effectively one has $\partial \omega_0/\partial r$ very large and positive compared to $1/\omega_0 \cdot \partial \omega_0/\partial L$, which is small and negative.

Therefore the angle $\beta$ is very small. With $\beta \approx 0$ and $\alpha \approx \pi$ it follows that $(\alpha - \beta) \approx \pi$.

Thus equation (5) can be simplified to:

$$(U - U_0) = -\frac{A}{F}(\omega'_0 - \omega_0) \quad (7)$$

Several important features follow from relation (7) above.

(1) Relation (7) shows clearly that a change in frequency is converted linearly into a corresponding amplitude change, hence a linear conversion from FM to AM modulation.

(2) The conversion gain factor A/F, is only a function of circuit parameters, independent therefore of the amplitude of both the injected signal and the oscillator signal. Therefore one has the equivalent of a limiter, hence AM rejection.

Figure 14:
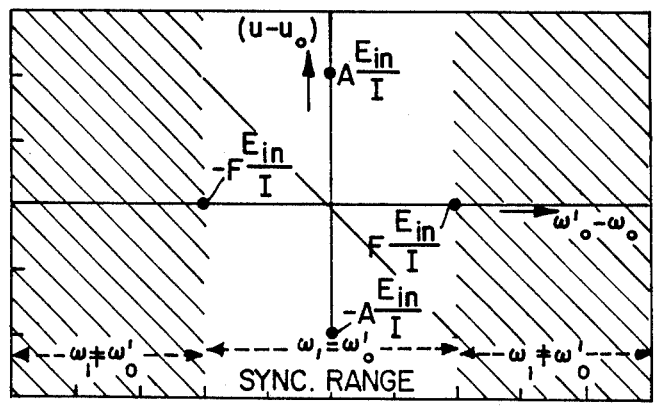
FIG. 14 shows graphically the operation of a synchronous FM discriminator and limiter.

Relation (7) is shown graphically in FIG. 14. Whereas the conversion gain A/F and hence the slope in FIG. 13 is independent of both the amplitude $E_{in}$ of induced RF signal and the amplitude of oscillation, one notices, as shown, that the range of synchronization depends both on the amplitude of induced signal $E_{in}$ and the amplitude $U=(I\omega_0 L)$, of oscillation.

The RF and local oscillator frequencies synchronize inside the synchronization range. The function of automatic frequency control of conventional FM receivers is therefore performed automatically.

MIXER

The function of a mixer, in a receiver, is to down-convert the frequency of the RF-signal to a more convenient lower level, as is commonly done in superheterodyne receivers.

In a homodyne type receiver, however, the RF signal has the same frequency as the local oscillator and therefore the beat signal is at DC. The basic requirement of a mixer is to have a non-linear behaviour so as to be able to produce the beat frequency. In the two-terminal negative admittance homodyne receiver as shown in FIG. 4, this non-linear behaviour is provided by the two-terminal negative admittance itself as well as by the non-linear loading of transistor 17 of the resonant tank circuit.

DEMODULATOR/AUDIO AMPLIFIER

As was explained above in connection with RF amplifier and synchronous FM discriminator/limiter, there is a linear conversion obtained from the FM modulation of the input RF-signal to AM modulation of the local oscillator signal. The AM modulation of the local oscillator signal however has to be demodulated to obtain a base-band output signal. The demodulation, audio amplification and low pass filtering are performed by transistor 17 shown in FIG. 4. The transistor 17 has no DC pre-bias. The positive peaks of the oscillating signal forward bias the transistor producing current pulses into the base. They are amplified by the transistor and smoothed by the RC low-pass network. The base band output signal is available at the collector of the transistor.

FREQUENCY-FEEDBACK-LOOP

Referring back to FIG. 4, transistor 17, plays an important role in a frequency-feedback-loop, via the base-collector junction capacitor $C_{bc}$.

We assume that the negative admittance circuit has synchronized with the induced RF-signal, hence $\omega_1 = \omega_0'$.

A change in the frequency $\omega_1$ of the induced RF-signal, results in a corresponding linear change in the oscillator signal U, as explained earlier.

This amplitude change is amplified, rectified and averaged by the transistor 17—operating in class-C mode— and results in a DC-signal on the collector.

The base-collector capacitance $C_{bc}$ is voltage dependent and therefore directly influenced by the voltage on the collector.

Varying the magnitude of $C_{bc}$ changes the resonance frequency $\omega_0$ of the tank circuit.

There is thus a frequency-feed-loop: a change in the frequency $\omega_1$ of the RF-signal is sensed by the negative admittance network and results in a change in the resonance frequency, $\omega_0$, of the tank circuit.

This external frequency tracking reduces the lock-in effort imposed on the negative admittance circuit to keep the induced RF-signal $(\omega_1)$ and oscillator signal $(\omega_0')$ synchronized, resulting in an extended synchronization range.

SUPERHETERODYNE FM-RECEIVER AND FREQUENCY-CONVERTER

The sensitivity of the homodyne receiver can be substantially improved by using negative admittance circuits to implement a superheterodyne type of FM receiver.

This permits signal amplification of the signal at the intermediate frequency before it is presented to the homodyne receiving stage, which is now operating at this intermediate frequency.

Figure 15:
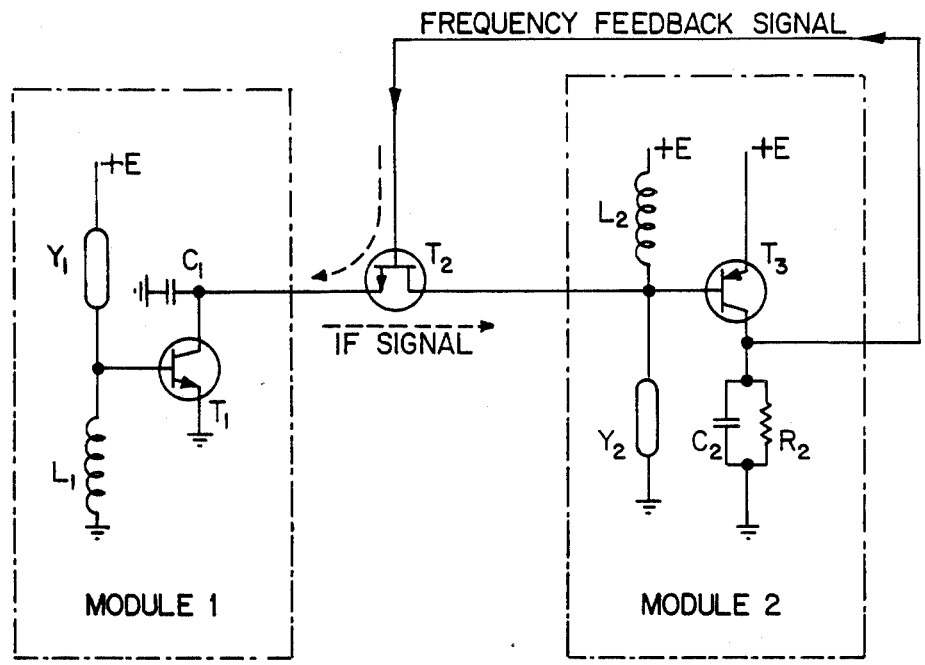
FIG. 15 is a circuit diagram of a superheterodyne FM receiver according to the present invention.
Figure 16:
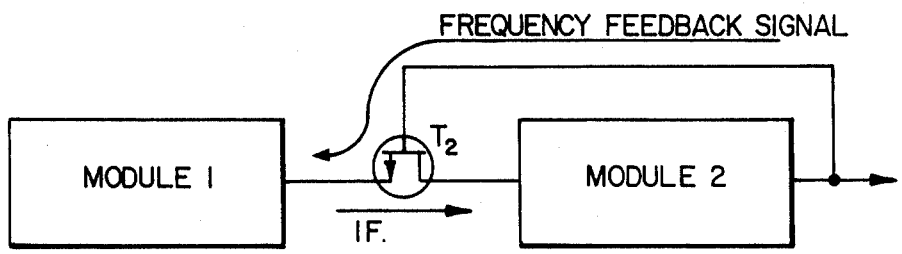
FIG. 16 illustrates the linking of the two modules of a superheterodyne FM receiver in both directions, by a coupling transistor $T_2$.

The circuit diagram of the negative admittance superheterodyne receiver is shown in FIG. 15. It can be separated into two functional modules which are linked together by transistor $T_2$, as schematically shown in FIG. 16.

The functions performed by these two modules are:
Module 1: Antenna, RF amplifier, RF local oscillator, RF mixer and IF amplifier
Module 2: IF local oscillator, IF mixer Synchronous Frequency discriminator with AM-rejection and Audio amplifier Module 1 and 2 are further linked by a : frequency-feedback-loop.

Note that for the analysis of the IF-amplifier one has to consider both module 1 and module 2, due to the close integration of these modules.

Module 2 operates as the homodyne FM receiver, however it now operates on the IF beat frequency produced by module 1.

The operation of the homodyne FM receiver has been described in detail above; we retain here only that it synchronises with the IF signal and that it produces a linear conversion from frequency to amplitude modulation.

The functions of module 1—also referred to as frequency converter—such as antenna, oscillator and mixer are essentially as described for the homodyne receiver. With regard to the mixer, the difference however is that the beat frequency is not taken at zero Hz but at a certain IF frequency.

A new function is that of the IF-amplifier. Also there is an outer frequency-feedback-loop which results in a substantial compression of the signal bandwith. These two functions will be described next.

IF-AMPLIFIER

Figure 17:
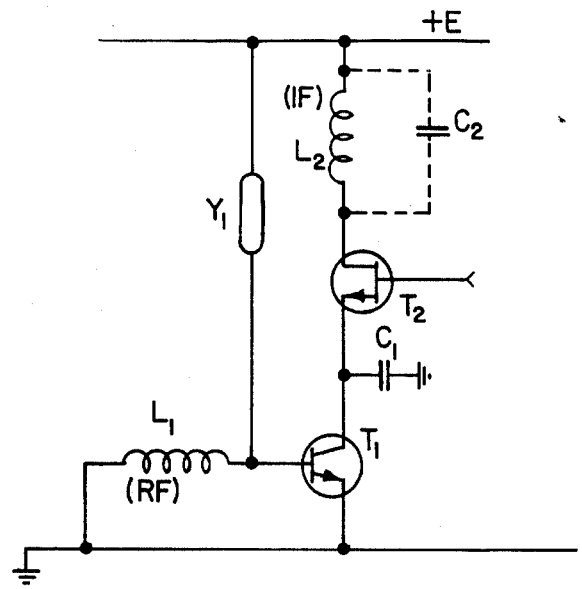
FIG. 17 is a circuit diagram of the frequency converter stage (module 1) of a superheterodyne FM receiver.

The circuit elements constituting the IF-amplifier are shown in FIG. 17. Transistor $T_1$ has no DC-prebias. The positive peaks of the RF local oscillator signal just exceed the base-emitter junction threshold of transistor $T_1$, producing current pulses in the transistor. These current pulses contain the IF beat signal which are amplified by transistor $T_1$ to produce an IF voltage signal across the IF tank circuit made up an inductance $L_2$ and total inherent circuit capacitance $C_2$. Capacitor $C_1$ by passes the RF signal at the collector of transistor $T_1$. Transistor $T_2$ decouples the IF signal from transistor $T_1$, allowing a larger IF gain to be obtained without oscillating instabilities. Transistor $T_2$ also completes the frequency-feedback-loop, described next.

FREQUENCY-FEEDBACK-LOOP

The homodyne stage of the superheterodyne receiver has its local frequency-feedback-loop. This functions as described for the homodyne receiver.

Figure 18:
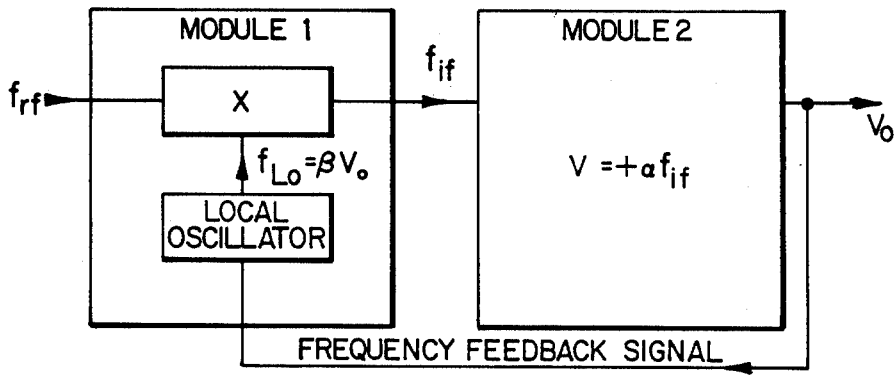
FIG. 18 illustrates the action of the external frequency feedback loop of a superheterodyne receiver.

There is another frequency-feedback-loop, an outer loop from output to input module, as indicated schematically in FIGS. 16 and 18.

In conventional superheterodyne FM receivers there is some limited form of feedback which is restricted to DC-operation and is referred to as automatic-frequency-control (AFC). Its role is to stabilize the frequency of the local oscillator. In the present embodiment the feedback is dynamic, i.e. all of a the signal output frequencies are fed back to the input, including the DC components.

The transistor $T_2$ (FIG. 16) is an essential "pivot point" between the two stages of the receiver, handling simultaneously and independently the information flow between these two stages. In the forward direction, transistor $T_2$ transmits the IF signal to the following stage and at the same time decouples the amplifier IF signal from the input stage. In the reverse direction, transistor $T_2$ takes the demodulated FM output signal and feeds it back to the input stage where it controls the frequency RF local oscillator. Transistor $T_2$ operates as an unity gain voltage follower imposing the output signal on the collector of transistor $T_1$ and therefore controlling, via the voltage dependent base collector junction capacitance $C_{bc}$ of transistor $T_1$, the frequency of the RF oscillator.

The essential operations of the FM receiver with regard to frequency feedback are illustrated in FIG. 18. The basic action of module 1 is to down convert the RF frequency to an intermediate frequency. Module 2 can here by simply considered as a frequency-to-voltage converter. Its output, via the feedback loop, controls the frequency of the RF-oscillator.

The first consequence is that the local oscillator frequency is slaved at a constant offset (IF frequency) to the RF-frequency. This is comparable to conventional automatic frequency control.

However all baseband signal frequencies are fed back. This has an important effect on the signal bandwidth.

Indicating variations in the frequencies by the symbol f, the following relations follow from inspection of FIG. 18.

$f_{if} = f_{rf} - f_{Lo}$ $V_0 = \alpha f_{if}$ $f_{Lo} = \beta V_0$ where $V_0$ is the output voltage and $\alpha$ and $\beta$ are conversion gain factors of module 1 and module 2.

Combining these relations, one can readily derive for the overall frequency-to-voltage conversion, $$\frac{V_0}{f_{rf}} = \frac{\alpha}{1 + \alpha\beta}$$

and for the frequency deviation compression ratio:

$$\frac{f_{rf}}{f_{if}} = 1 + \alpha\beta$$

Assuming some typical values for $\alpha$ and $\beta$, 1 volt/kHz and 1 MHz/volt respectively one obtains, $$\frac{V_0}{f_{rf}} = 1 \text{ volt/MHz and } \frac{f_{rf}}{f_{if}} \approx 1000$$

Consequently a 100 kHz deviation of the RF frequencies produces only a 100 Hz deviation of the IF frequency and an output voltage change of 100 mV.

It is obvious therefore that, contrary to conventional FM receivers, a substantial signal bandwidth compression takes place from RF to IF. The IF stage has to pass only the modulation frequencies and not the large associated frequency deviations inherent in the frequency modulation process.

I claim:

1. A superheterodyne FM receiver comprising:
   first and second two-terminal negative admittance networks,
   a resonance structure in which a frequency modulated RF signal is induced, connected in series with the first negative admittance network,
   a first transistor connected to the point connecting the resonance structure and the first negative admittance network,
   a bypass capacitor connected to the output terminal of the first transistor for bypassing the RF signal,
   a second transistor connected to the first transistor in series therewith,
   a coil and the second negative admittance network connected in series with each other, the output of the second transistor being connected to the point connecting the coil and the second negative admittance network,
   a third transistor being connected to the said point connecting the coil and the second negative admittance network,
   the third transistor producing a frequency demodulated output signal at its output terminal, a resistor and capacitor connected in parallel with each other, one end of which is connected to the output terminal of the third transistor and the other to be connected to one of the polarities of a power supply, and
   a frequency feedback loop connecting the third transistor and the second transistor for feeding back the frequency demodulated output signal to the second transistor to control the frequency of the resonance structure.

2. The superheterodyne FM receiver according to claim 1 wherein each of the first and second two-terminal negative admittance networks includes a pair of transistors.

* * * * *